Aug. 29, 1961 R. BEAGLES 2,998,573

SIGNAL GENERATOR HAVING AN OUTPUT LINEARLY RELATED TO AN INPUT FUNCTION

Filed Jan. 28, 1957

INVENTOR.
ROBERT BEAGLES
BY
J. L. Whittaker
ATTORNEY

United States Patent Office 2,998,573

Patented Aug. 29, 1961

2,998,573

SIGNAL GENERATOR HAVING AN OUTPUT LINEARLY RELATED TO AN INPUT FUNCTION

Robert Beagles, Pacific Palisades, Calif., assignor to Radio Corporation of America, a corporation of Delaware Filed Jan. 28, 1957, Ser. No. 636,690
1 Claim. (Cl. 331—37)

The present invention relates to an improved signal generator which is capable of producing an output signal, the frequency of which is linearly related to an input function over a broad frequency range.

In many applications it is necessary that extremely stable amplification or frequency generation stages be employed. The price ordinarily paid for the highly stable output is that the circuit is linear only over a relatively limited range. In other words, the output function is directly proportional to the input function only over a restricted portion of a frequency spectrum of possible interest.

An object of the present invention is to provide an improved, highly stable signal generator or amplifier which, in addition, is linear over an extended range of frequencies.

A more specific object of this invention is to provide an improved ultra-high frequency generator in which the output frequency may be changed in steps having a magnitude of the order of 0.02% and an accuracy on the order of 0.0002% (2 parts per million).

Yet another object of the present invention is to provide an improved oscillator the output frequency of which may be swept either continuously over an extended frequency range or in discrete steps over an extended frequency range, or stepped in frequency to a frequency range of interest and then continuously swept in frequency over this range of interest.

According to this invention, two highly stable signal generators are employed. Both suffer from the disadvantage, outlined above, of having only a restricted output range within which they are linear. A parameter of the output signal of one of the generators is varied, preferably only over the range within which the generator is linear. In a practical system, for example, the parameter may be frequency and the frequency may be swept in a sawtooth manner. The generator may be crystal-controlled. The second oscillator output signal parameter (frequency, in this example) is changed in discrete steps and over a range which may extend beyond the range within which the second generator is linear. The output signals of the two generators are mixed, one of the side bands detected, and that side band multiplied to provide output signals in the frequency range of interest. Since the output of the first signal generator is linear and occurs during the time that the output frequency of the second signal generator is maintained constant, the output frequency of the frequency multiplier stage is linear during any step. If desired, the magnitude of each step of the signal applied to the second frequency generator may be adjusted to compensate for any non-linearity in the second frequency generator.

Figure 1:
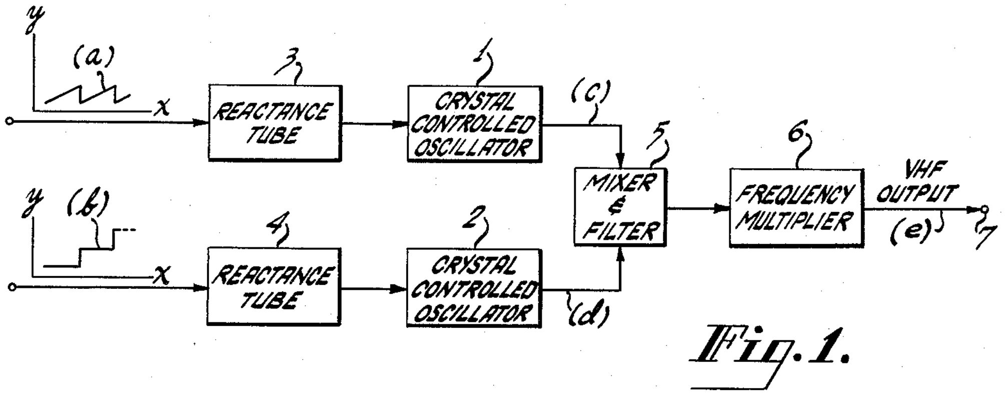
Figure 2:
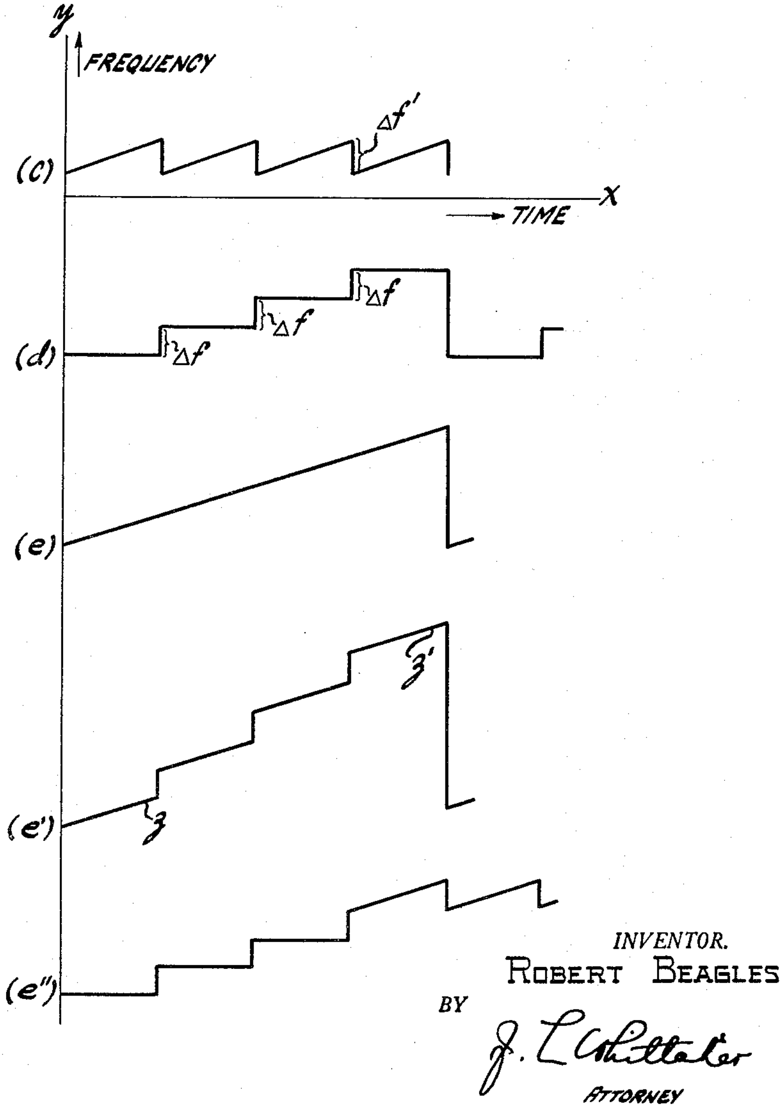

The invention will be described in greater detail by reference to the following description taken in connection with the accompanying drawing in which:

FIGURE 1 is a block circuit diagram of a preferred form of the present invention; and FIGURE 2 shows waveforms present at various points in the circuit of FIGURE 1.

Referring to the drawing, the first and second signal generators 1 and 2 comprise crystal-controlled oscillators. These stages are highly stable, however, their output frequencies are linear only over a restricted frequency range. The output frequencies of the crystal oscillators are controlled by reactance tubes 3 and 4, respectively. If the output frequency is to be swept over a frequency band, the input signal *a* to reactance tube 3 consists of a sawtooth wave. As illustrated in FIGURE 1, the *x* coordinate of the input signal is time and the *y* coordinate amplitude. Preferably, the amplitude of the signal is such that the crystal-controlled oscillator is not driven beyond the linear portion of its characteristic.

The signal applied to reactance tube 4 consists of a step type signal *b*. Again, the *x* coordinate is time and the *y* coordinate amplitude. This step signal may be of an amplitude such that the oscillator operates outside of the linear portion of its output range. As will be explained in more detail below, the steps of wave *b* may be adjusted, if desired, so as to compensate for the non-linearity of the oscillator frequency output characteristic.

The wave output *c* of oscillator 1 is shown in FIGURE 2*c*. Throughout FIGURE 2 the *x* coordinate is time and the *y* coordinate frequency. The output signal of oscillator 2 consists of a step type signal *d*. Signals *c* and *d* are mixed in mixer stage 5 and one of the resultant side-band frequencies passed to frequency multiplier 6. The means for segregating the side-band frequency of interest may, for example, comprise a band-pass filter. Frequency multiplier 6, which may consist of a circuit tuned to a harmonic of the side-band frequency of interest and an amplifier for amplifying the output signal of this circuit, produces an output frequency wave *e*.

In one mode of operation of the circuit shown in FIGURE 1, the sweep signal *a* may be applied to reactance tube 3 synchronously with the step signal 3 applied to reactance tube 4. The duration of each sweep is equal to the duration of each step. If it is desired to have a continuously swept output frequency wave as shown in FIGURE 2*e*, the amplitude of wave *d* is made such that the frequency change $\Delta f$ between successive steps is equal to the frequency change $\Delta f'$ produced during each sweep of crystal-controlled oscillator 1. In order to do this, it may be necessary to make the steps of input wave *b* of different heights in order to compensate for the non-linearity of crystal-controlled oscillator 2.

In another mode of operation, the frequency changes $\Delta f$ between steps of wave *d* need not be made equal to the frequency band $\Delta f'$ through which crystal-controlled oscillator 1 is swept. In the event that steps $\Delta f$ are of greater amplitude than band $\Delta f'$, an output wave *e'* is produced.

In the foregoing discussion, it is mentioned that in a preferred form of the invention input wave *a* is swept only over the linear portion of the output frequency characteristic of the crystal-controlled oscillator. However, in other embodiments the amplitude of input wave *a* may be such that the oscillator 1 operates partially outside of the linear portion of its characteristic. In these embodiments it is necessary to calibrate the input versus output characteristic of the crystal-controlled oscillator 1. The calibration need be made for only one step of the input signal *b* and will remain the same for the remaining steps of input signal *b*. In other words, taking a practical example, if there is 5% non-linearity in a portion *z* of the first step of the wave of FIGURE 2*e'*, there will also be 5% non-linearity in the corresponding portion *z'* of the last step of the wave of FIGURE 2*e'*.

The circuit of FIGURE 1 may be operated in still another way. In this last manner of operation, signal *b* is first applied to reactance tube 4 in order to step the output frequency of oscillator 2 to a frequency such that the wave at terminal 7 is in the frequency band of interest. After the frequency range of interest is reached, the signal *a* is applied to reactance tube 3. The output wave of frequency multiplier 4 is then as shown in FIGURE 2e''. To take a typical example, suppose the first step of the wave applied to reactance tube 4 corresponds to a frequency output at terminal 7 of 10 megacycles. Assume also that each step changes the output frequency 2000 cycles. Assume also that input wave *a* produces an output sweep $\Delta f$ at terminal 7 of 2000 cycles. It is desired to sweep the band between 10.008 megacycles and 10.01 megacycles continuously. Under these conditions, the output wave of frequency multiplier 6 would first be swept to 10.008 megacycles (four steps of the input wave *b* applied to reactance tube 4). The input wave to the reactance tube is then maintained at constant amplitude so that the output frequency of crystal oscillator 2 is maintained constant. Now, the sweep signal *a* is applied to reactance tube 3. This results in an output wave at terminal 7 which sweeps continuously from 10.008 to 10.01 megacycles.

In a practical circuit designed for a particular signal generator system, the crystal-controlled oscillator 1 was tuned to 11.8 megacycles at its center frequency and crystal-controlled oscillator 2 was tuned to 8.5 megacycles at its center frequency. The filter in stage 5 was tuned to the difference frequency, that is, approximately 3.3 megacycles. Frequency multiplier 6, which consisted of two tripler stages, produced an output signal equal to 9 times the beat frequency, that is, equal to 29.7 megacycles.

In the specific embodiments discussed above, the filter in stage 5 is tuned to the difference frequency between oscillators 1 and 2, however, it may be tuned to the sum frequency instead. Alternatively, in some applications, it may be desirable to provide two output signals, one derived from the sum frequency and the other from the difference frequency. In such case, separate frequency multiplier stages would be employed.

In the circuit shown in FIGURE 1, the input functions to stages 3 and 4 are electrical signals. However, the invention is equally applicable to a system which is hand controlled. In a system of this type reactance tubes 3 and 4 may be eliminated. The sweep signal input to stage 1 is simulated by a manually variable capacitor and the step signal applied to stage 2 is simulated by a manually adjustable bank of condensers of different values at the input circuit of oscillator 2. A system of this type is useful as a highly stable signal generator for testing purposes.

The specific embodiment of the invention described in detail above illustrates one use of the invention. There are others. The sweep type signal applied to the first oscillator may be replaced with any type of modulating signal, for example, one derived from speech. In this mode of operation the entire system shown in FIGURE 1 may be employed as a multiplexing system. Each step of the input function corresponds to one transmitting channel and the incoming information from separate sources is applied to the first reactance tube 3 at times corresponding to successive steps of the wave applied to reactance tube 4.

What is claimed is:

A circuit for producing an output signal which varies linearly in frequency with respect to an input signal over an extended operating range comprising, in combination, a first frequency generator stage the output frequency of which may be controlled by an input signal and which varies linearly with said input signal over a restricted operating range; a second frequency generator stage having the same characteristics as the first stage; means for applying a sawtooth type signal to the first stage having an amplitude which is within the linear portion of the range of the first stage; means for applying a step type signal to the second stage which may extend outside of the linear portion of the operating characteristic of the second stage; means for mixing the output signals of said two stages to obtain a side-band frequency; and means for multiplying said side-band frequency to a substantially higher frequency; each frequency generator stage comprising a crystal-controlled oscillator; and the input circuit to each oscillator including a reactance tube and each input signal consisting of an electrical signal which is applied to the reactance tube.

References Cited in the file of this patent

UNITED STATES PATENTS

| | | |
|---|---|---|
| 2,162,335 | Jacob | June 13, 1939 |
| 2,311,026 | Bishop | Feb. 16, 1943 |
| 2,438,392 | Gerber | Mar. 23, 1948 |
| 2,458,760 | Andersen | Jan. 11, 1949 |
| 2,488,297 | Lacy | Nov. 15, 1949 |
| 2,756,331 | Forster et al. | July 24, 1956 |
| 2,774,943 | Watson | Dec. 18, 1956 |
| 2,785,310 | Leister | Mar. 12, 1957 |
| 2,816,229 | Vantine | Dec. 10, 1957 |